United States Patent
Yu et al.

(10) Patent No.: US 8,263,422 B2
(45) Date of Patent: Sep. 11, 2012

(54) BOND PAD ISOLATION AND CURRENT CONFINEMENT IN AN LED USING ION IMPLANTATION

(75) Inventors: San Yu, Westford, MA (US); Chi-Chun Chen, Gloucester, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 13/090,301

(22) Filed: Apr. 20, 2011

(65) Prior Publication Data
US 2011/0263054 A1    Oct. 27, 2011

Related U.S. Application Data

(60) Provisional application No. 61/327,931, filed on Apr. 26, 2010.

(51) Int. Cl.
*H01L 21/00* (2006.01)

(52) U.S. Cl. ............ 438/34; 438/22; 438/26; 438/33; 257/E21.001; 257/E33.008

(58) Field of Classification Search .......... 438/33; 257/E33.008
See application file for complete search history.

(56) References Cited

U.S. PATENT DOCUMENTS

| 5,091,757 | A | 2/1992 | Yoshida | |
| 5,094,970 | A * | 3/1992 | Yoshida et al. | 438/33 |
| 6,547,249 | B2 | 4/2003 | Collins et al. | |
| 6,998,642 | B2 | 2/2006 | Lin et al. | |
| 2005/0082558 | A1* | 4/2005 | Yang et al. | 257/97 |
| 2007/0194346 | A1* | 8/2007 | Nagase et al. | 257/146 |
| 2008/0217635 | A1 | 9/2008 | Emerson et al. | |
| 2009/0104726 | A1 | 4/2009 | Slater et al. | |

FOREIGN PATENT DOCUMENTS

WO    2004102686 A1    11/2004

* cited by examiner

*Primary Examiner* — Angel Roman

(57) ABSTRACT

An improved method of creating LEDs is disclosed. Rather than using a dielectric coating to separate the bond pads from the top surface of the LED, this region of the LED is implanted with ions to increase its resistivity to minimize current flow therethrough. In another embodiment, a plurality of LEDs are produced on a single substrate by implanting ions in the regions between the LEDs and then etching a trench, where the trench is narrower than the implanted regions and positioned within these regions. This results in a trench where both sides have current confinement capabilities to reduce leakage.

9 Claims, 5 Drawing Sheets

US 8,263,422 B2

BOND PAD ISOLATION AND CURRENT CONFINEMENT IN AN LED USING ION IMPLANTATION

This application claims priority of U.S. Provisional Patent Application Ser. No. 61/327,931, filed Apr. 26, 2010, the disclosure of which is incorporated herein by reference in its entirety.

FIELD

This invention relates to fabrication of light emitting diodes (LEDs) and, more particularly, to ion implantation of LEDs.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

LEDs are built on a substrate and are doped with impurities to create a p-n junction. A current flows from the p-side, or anode, to the n-side, or cathode, but not in the reverse direction. Electrons and holes flow into the p-n junction from electrodes with different voltages. If an electron meets a hole, it falls into a lower energy level and releases energy in the form of a photon. The wavelength of the light emitted by the LED and the color of the light may depend on the band gap energy of the materials forming the multiple quantum well (MQW).

FIG. 6 is a cross-sectional side view of a vertical LED structure. The LED 700 has p electrodes (or p mirrors) 701 (illustrated by the hash marks). These p electrodes 701 function as a p-ohmic contact and/or an optical reflection mirror. In other words, the p electrodes 701 serve to reflect light back toward the upper surface (i.e. above the n-type layer 705).

A p-type layer 703 is disposed on the p electrodes 701. A multiple quantum well (MQW) 704 is disposed on the p-type layer 703. An n-type layer 705 is disposed on the MQW 704. Finally, n electrodes 706 are disposed on the n-type layer 705. This LED 100 may be mounted on a metal alloy in one instance. The p-type layer 703 and n-type layer 705 may be, for example, GaN or AlGaInP. The MQW 704 may be GaInN or AlGaInP.

Some LED structures have optical reflection problems while others have leakage current problems. Dielectric coatings 710, such as $SiO_2$ or $SiN_x$, have been used as isolation layers or to isolate bond pads 711 within LEDs. For example, such a dielectric coating 710 may be formed under the bond pads, as shown in FIG. 6. These dielectric coatings 710 also have been formed around mesa perimeters for current confinement. This dielectric coating 710 forces the current toward the electrodes 706 and away from the bond pads 711, because the bond pads 711 tend to block the light that is being emitted. However, formation of a dielectric coating 710 may lower LED manufacturing throughput and add cost and complexity to manufacturing.

Accordingly, there is a need in the art for an improved LED structure and methods of LED ion implantation.

SUMMARY

An improved method of creating LEDs is disclosed. Rather than using a dielectric coating to separate the bond pads from the top surface of the LED, this region of the LED is implanted with ions to increase its resistivity to minimize current flow therethrough. In another embodiment, a plurality of LEDs are produced by implanting ions to generate isolation regions first between the individual LEDs and then fabricate mesas, where the trench of mesa etch is narrower than the implanted regions and positioned within these regions. This results in a trench where both sides have current confinement capabilities to reduce leakage.

BRIEF DESCRIPTION OF THE DRAWINGS

For a better understanding of the present disclosure, reference is made to the accompanying drawings, which are incorporated herein by reference and in which.

DETAILED DESCRIPTION

The method is described herein in connection with ion implantation of LEDs. However, the method can be used with other semiconductor manufacturing processes. A beam-line ion implanter, plasma doping ion implanter, or other ion implantation system known to those skilled in the art may be used in the embodiments described herein. Furthermore, the embodiments described herein may apply to vertical LEDs, lateral LEDs, flip chip LEDs, p-side up LEDs, or other LED architectures known to those skilled in the art. Thus, the invention is not limited to the specific embodiments described below.

Ion implantation may be used to improve current confinement or reduce leakage through a sidewall of an LED. This may improve the current and light efficiency of the LED. Ion implantation also may isolate a bond pad or confine current to an effective emission area by isolating the semiconductor under the bond pads. Consequently, an improved LED may be manufactured using ion implantation.

Figure 1:
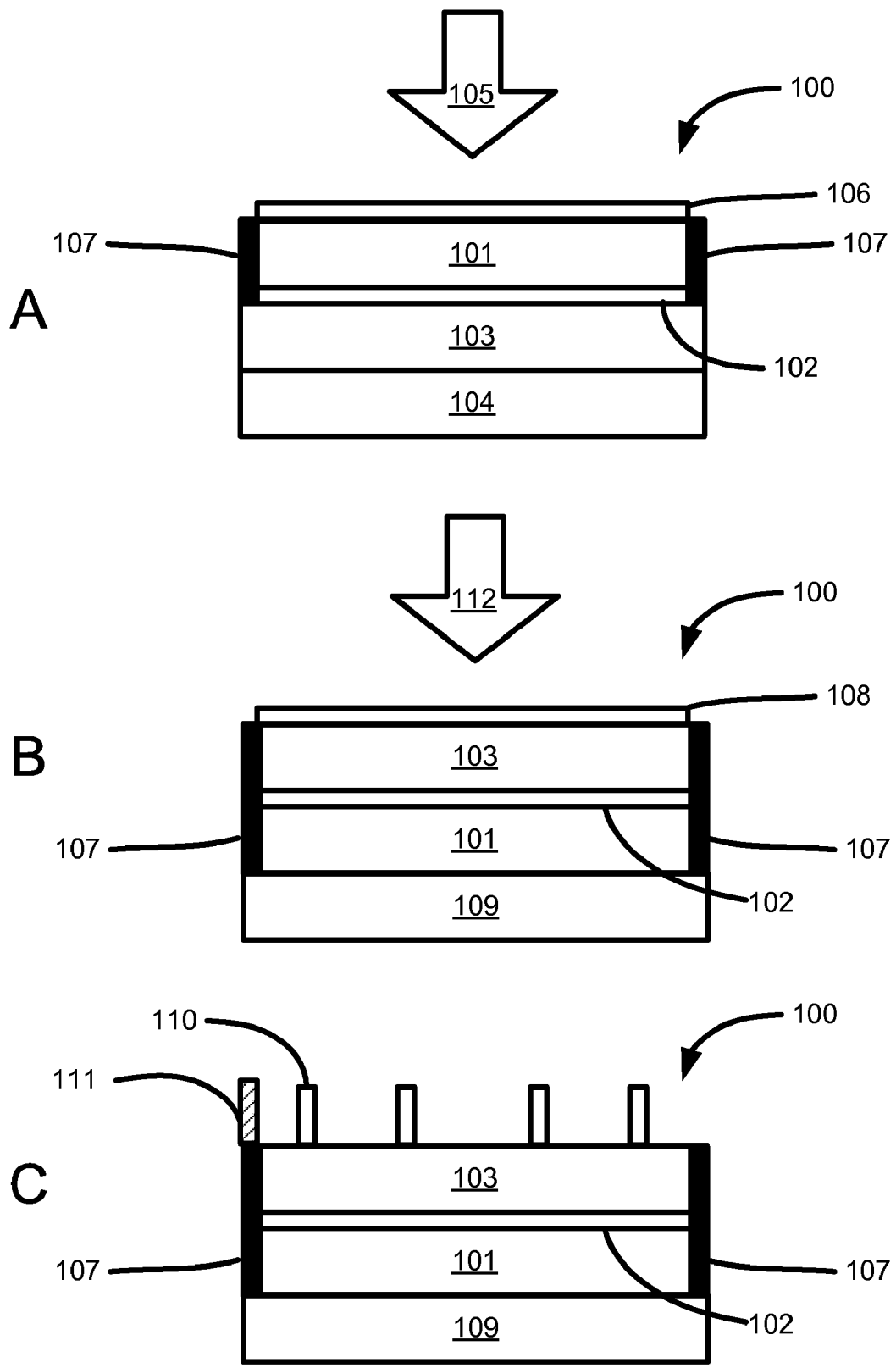
FIGS. 1A-C are cross-sectional side views of a first embodiment of ion implantation into an vertical structure LED.

FIG. 1A is a cross-sectional side view of a first embodiment using ion implantation to create isolation within an LED. This embodiment is used in conjunction with a vertical LED with the N side up. The LED 100 has a p-type layer 101 disposed on a multiple quantum well (MQW) 102. The MQW 102 is disposed on an n-type layer 103, which in turn is disposed on a substrate 104. Various methods of creating such a LED are well known and will not be described herein. The p-type layer 101 and n-type layer 103 may be, for example, GaN or AlGaInP. In one particular embodiment of FIG. 1A, the LED 100 may be one mesa.

In FIG. 1A, a mask 106 has been placed on the p-type layer 101. This mask 106 may be a hard or soft mask on the LED 100 made of, for example, photoresist, an oxide, or a metal. In an alternate embodiment, the mask 106 is a shadow mask or stencil mask that is upstream of the LED 100, between the ions 105 and the LED 100, and may or may not be disposed directly on the LED 100. After placement of the mask 106, ions 105 are implanted into the LED 100. The ions 105 may be implanted at, for example, a current of between approximately 50 μA to 10 mA and an energy of between approximately 10 eV to 5 MeV, although other currents and energies may be used. These ions 105 may be, for example, H, N, He, Ar, O, Cr, Fe, Ne, F, Ti, C, B, P, Si, or other species known to those skilled in the art. The ions 105 are implanted into the LED 100 in areas exposed by the mask 106. Thus, the mask 106 prevents implantation in the regions beneath the mask 106.

Implant regions 107 (shaded black in FIG. 1) are formed using the ions 105 and mask 106. These implant regions 107 may be at a depth such that ions are implanted into both the p-type layer 101 and MQW 102. The energy of the ions 105 may be configured to enable the desired implant depth. Higher implant energy typically means a greater implant depth.

The ions 105 change the resistivity within the implant regions 107 in the LED 100. This resistivity in one instance increases by approximately five orders of magnitude. Therefore, the implanted regions 107 will not conduct current as well as the other regions of the LED 100. These implant regions 107 may be around the mesa or die perimeter or in the region where the bond pad will be located to confine current within the effective device emission area of the LED 100 to improve efficiency of the LED 100.

In FIG. 1B, the LED 100 in FIG. 1A has been turned over, and the substrate 104 has been removed. The LED 100 is then placed on a p mirror (or p electrode) 109, and a second mask 108 has been applied to the n-type layer 103. This second mask 108 may be a hard or soft mask on the LED 100, but in an alternate embodiment, the second mask 108 is a shadow mask or stencil mask that is upstream of the LED 100 and may or may not be disposed directly on the LED 100. Ions 112 are implanted into the regions of the LED 100 exposed by the mask 108. The ions 109 may be the same as the ions 105 in FIG. 1A. This may extend the implant regions 107 into the n-type layer 103.

In FIG. 1C, at least one n-finger electrode 110 has been applied to the n-type layer 103 in the LED 100. In addition, at least one bond pad 111 (shown in crosshatch) has been applied to the n-type layer 103. The implant regions 107 provide electron confinement within the LED 100. Furthermore, the implant regions 107 are located beneath the bond pads 111, thereby forcing the current away from the portions of the LED 100 beneath the bond pads 111, where emitted light would be blocked by the bond pad 111.

In an alternate embodiment, a single or chained implant of ions 105 at a higher energy than illustrated in FIG. 1A may form implant regions 107 in the p-type layer 101, MQW 102, and n-type layer 103.

In yet another alternate embodiment, a single or chained implant of ions 112 at a higher energy than illustrated in FIG. 1B may form implant regions 107 in the n-type layer 103, MQW 102 and p-type layer 101.

In other embodiments, a single or chained implant, such as is shown in either FIG. 1A or FIG. 1B, is performed so as to create implant regions 107 in the MWQ 102, and in one of the p-type layer 101 or the n-type layer 103. In other words, the implant regions 107 may be in the p-type layer 101 and the MQW 102 (in the case of FIG. 1A) or in the n-type layer 103 and the MQW 102 (in the case of FIG. 1B). In these embodiments, the other layer is not implanted.

Figure 2:
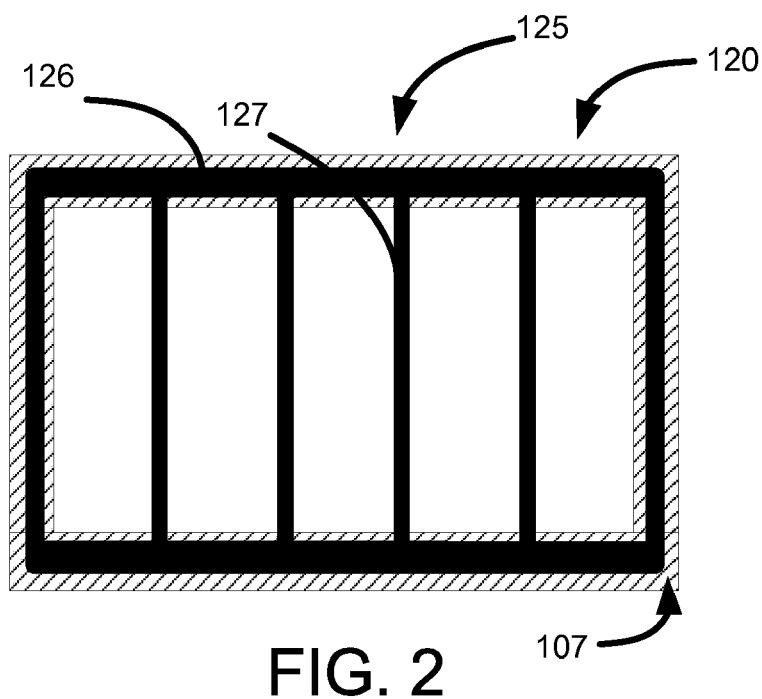
FIG. 2 is a top perspective view of a vertical LED.

FIG. 2 is a top perspective view of an LED 120. A metal frame 125 includes bond pad regions 126 and finger electrodes 127. The metal frame 125 has multiple finger electrodes 127, which are disposed on the exposed surface of the LED 120. Bond pads may be attached to the metal frame 125, such as along one or more edges. These bond pads may tend to block any light being emitted by the LED 120 in the regions below the bond pad. Therefore, implanted regions 107 (shown in crosshatch) are created in the regions beneath the outer edge of the metal frame 125. Thus, after the bond pads are attached, current is forced through the metal frame 125 toward the finger electrodes 127, where the regions below have not been implanted. By using ion implantation to create implant regions 107, it is not necessary to deposit a dielectric coating on the top surface of the LED 120 to isolate the bond pad regions 126 from the top surface.

Therefore, the LED is made by creating a device having a p-type layer 101, a MQW 102 and the n-type layer 103. One or more ion implants is performed to introduce ions into the MQW 102 and at least one of the n-type layer 103 and the p-type layer 101. These implants create implant regions 107 through which isolate the current flowing through. These implant regions 107 are introduced into regions of the device where the bond pads will be attached at a later step of the manufacturing process. The metal frame 125 is then attached to the top of the device, without the use of a dielectric coating. As noted above, the dielectric coating is not needed since the implanted regions 107 are directly beneath the bond pads and do not conduct current well. This forces the current passing through the metal frame 125 to flow through the finger electrodes 127. This improves the current distribution and improves light efficiency.

Figure 3:
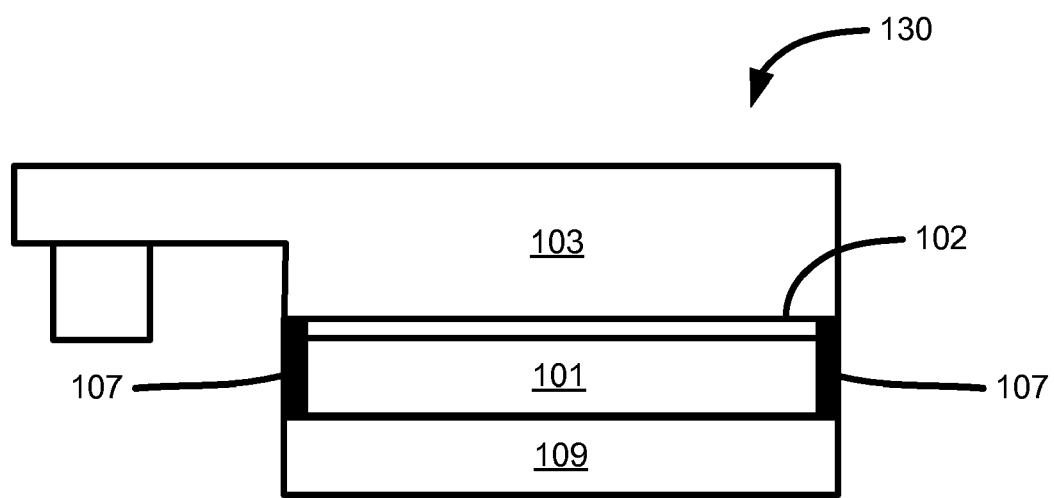
FIG. 3 is a cross-sectional side view of an embodiment of a flip chip LED.

FIG. 3 is a cross-sectional side view of an embodiment of a flip chip LED. The LED 130 has an n-type layer 103 disposed on the MQW 102. The p-type layer 101 is disposed between the MQW 102 and p mirror (or p electrode) 109. This flip chip LED may be manufactured using techniques similar to those used in FIG. 1. Ions are implanted at an energy so that implant regions 107 are formed on either side of the p-type layer 101 and MQW 102. This implant is preferably performed prior to the attachment of the p mirror 109. These implant regions 107 provide electron confinement within the LED 130.

Figure 4:
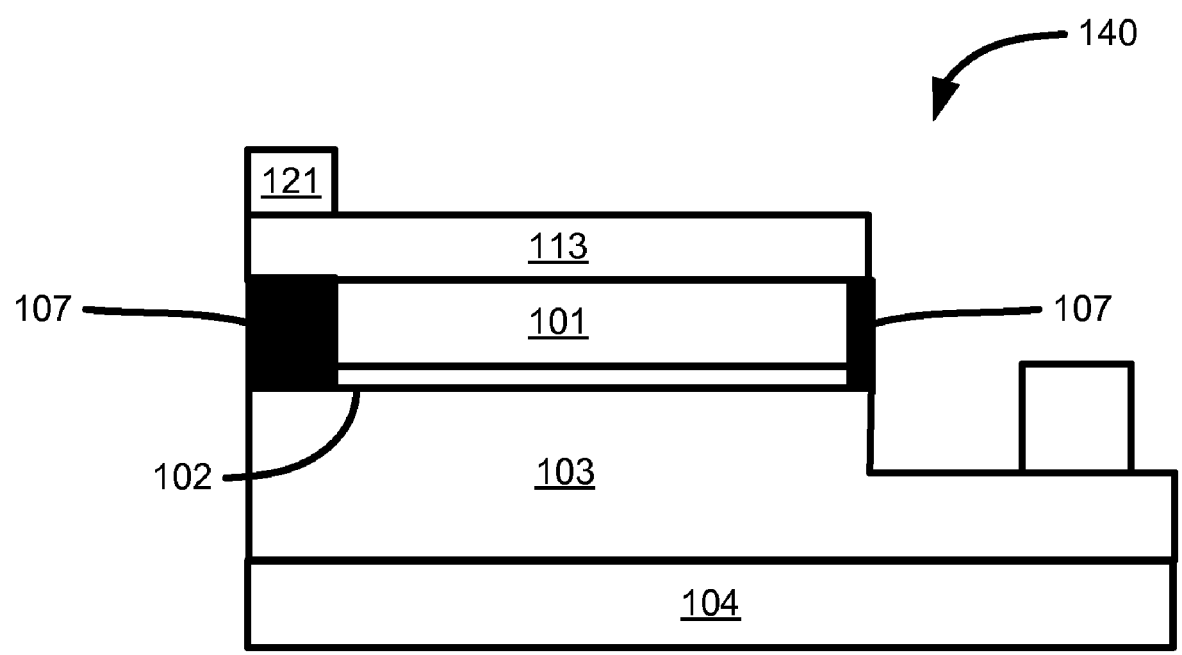
FIG. 4 is a cross-sectional side view of an embodiment of a p-side up lateral structure LED.

FIG. 4 is a cross-sectional side view of an embodiment of a p-side up lateral LED. The LED 140 has an n-type layer 103 disposed on the substrate 104. An MQW 102 is disposed on the n-type layer 103 and the p-type layer 101 is disposed between the MQW 102 and a transparent-conductive layer (TCL) 113. This LED may be manufactured using techniques similar to those used in FIG. 1. A bond pad 121 sits on this TCL 113. Implant regions 107 are formed on either side of the p-type layer 101 and MQW 102 but could also be any depth into the layer stack of LED. In this particular embodiment, one implant region 107 is formed in the region under the bond pad 121 and has an approximately similar width as the bond pad 121 or slightly wider than the bond pad 121, as was shown in FIG. 2. These implant regions 107 provide electron confinement within the LED 140. The implant regions 107 also may isolate the bond pad 121. Isolating the bond pad 121 will prevent current from running through the LED 140 in areas covered by the bond pad 121, which may be opaque. Thus, the current may be forced into the effective emission areas of the LED 140 and the efficiency of the LED 140 may be improved.

Figure 5:
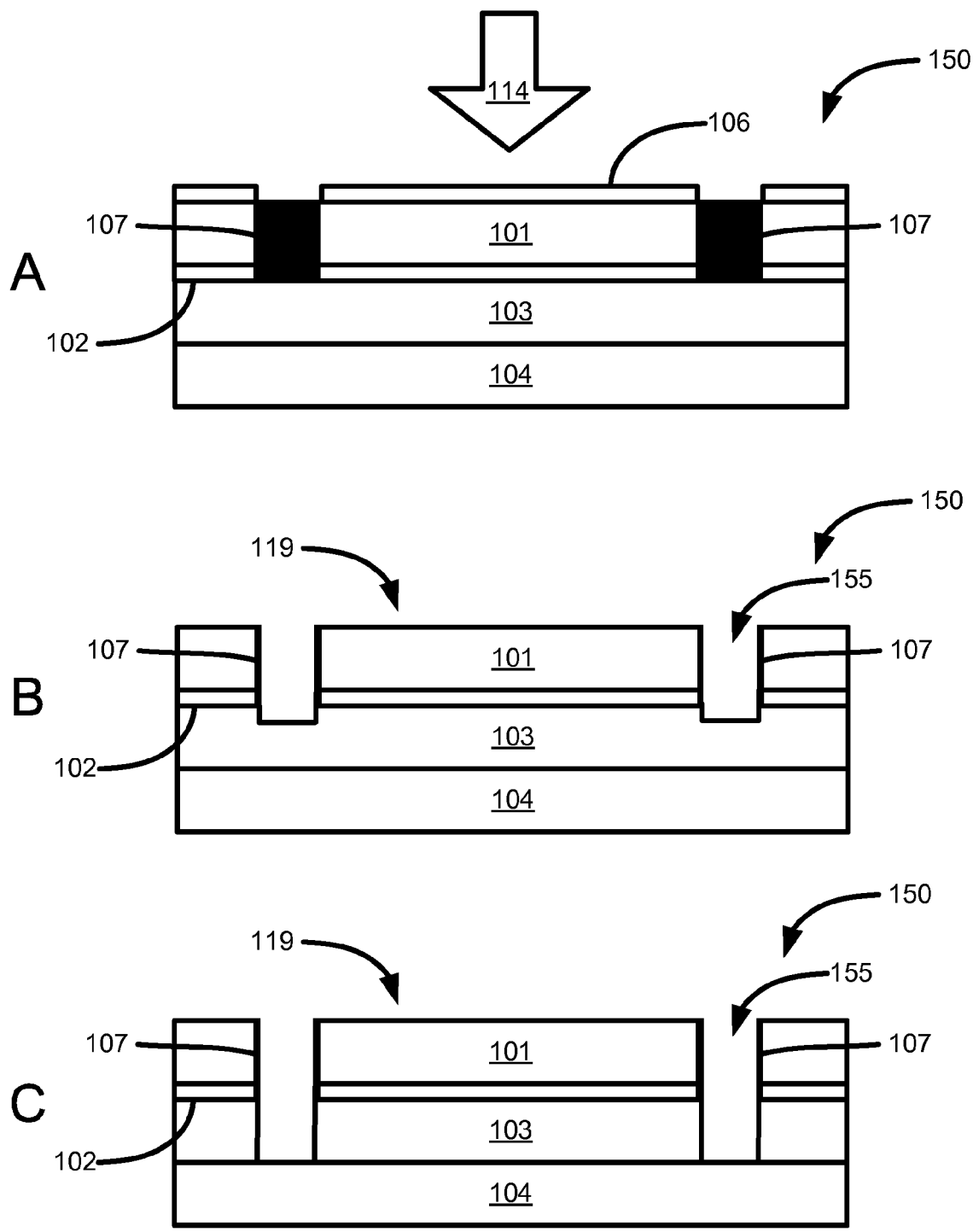
FIGS. 5A-C are cross-sectional side views of a second embodiment of ion implantation into an LED.
Figure 6:
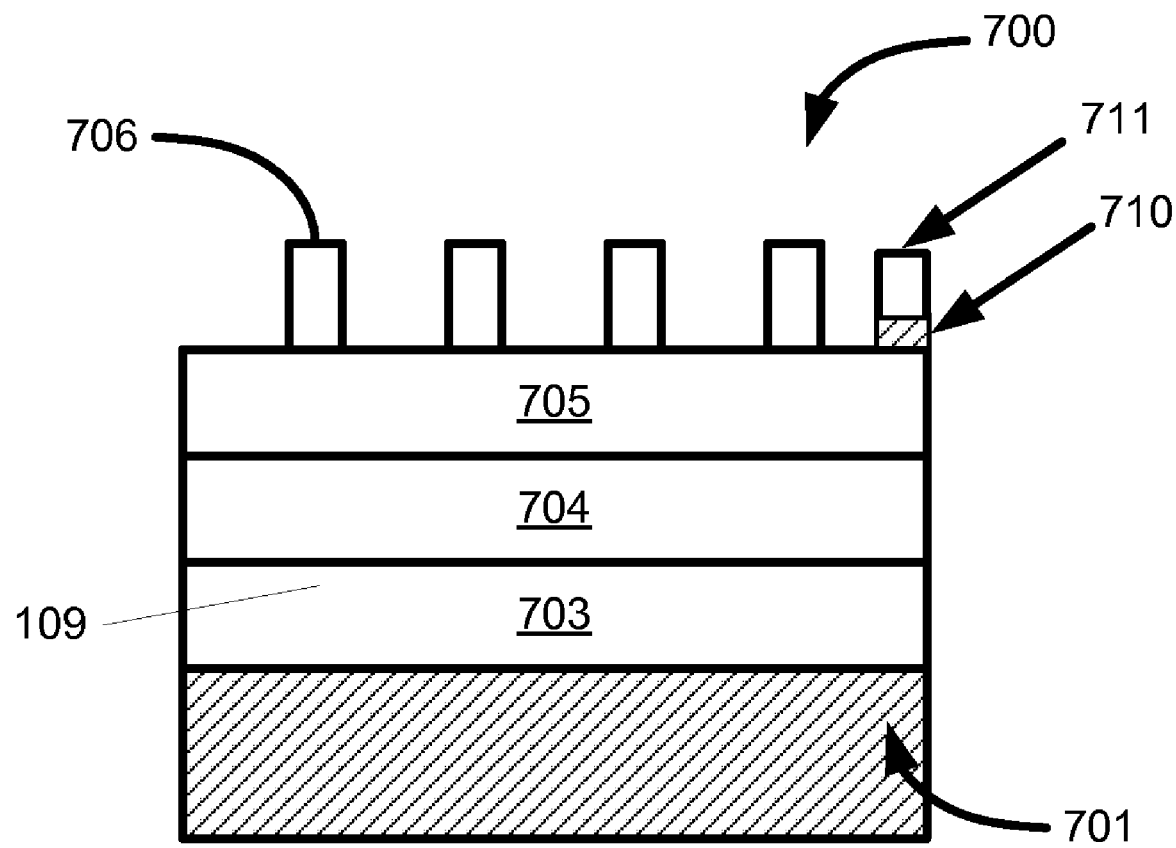
FIG. 6 is a cross-sectional side view of a vertical LED of the prior art.

FIGS. 5A-C are cross-sectional side views of a second embodiment of ion implantation into an LED. In FIG. 5A, the n-type layer 103 in LED 150 is disposed on the substrate 104. An MQW 102 is disposed on the n-type layer 103 and the p-type layer 101 is disposed on the MQW 102. A mask 106 has been placed on the p-type layer 101. This mask 106 may be a hard or soft mask on the LED 150, but in an alternate embodiment, the mask 106 is a shadow mask or stencil mask that is upstream of the LED 150 and may or may not be disposed directly on the LED 150. Ions 114 are implanted into the LED 150 to form the implanted regions 107. These ions 114 may be, for example, H, N, He, Ar, O, Cr, Fe, Ne, F, Ti, or other species known to those skilled in the art. The ions 114 are implanted into the LED 150 in areas exposed by the mask 106 and form the implant regions 107. Thus, the mask 106 prevents implantation of ions 114 under the mask 106. These implant regions 107 provide electron confinement within the LED 150. This step may be performed in the fabrication of both vertical and lateral LEDs.

FIG. 5B depicts a subsequent processing step in the creation of a lateral LED. In FIG. 5B, a mesa etch is performed form the lateral LED. This etching process forms trenches 155. This operation is performed such that part of the implanted regions 107 is etched away, while leaving some portion of the implanted regions 107 on either side of the trench 155. In other words, the trench 155 is narrower than the implanted region 107, and positioned within that implanted region 107. The trenches 155 extend downward to at least the depth of the implanted region 107, but may go deeper into the n-type layer 103. A portion of the implanted regions 107 remains on the side of the mesas 119 with the implanted regions 107 removed at the bottom of the trenches 155. This creates implanted sidewalls on either side of the trench 155 using a single or chained ion implant while having the bottom still conducting for n electrode contact.

FIG. 5C depicts a subsequent processing step in the creation of a vertical LED. In FIG. 5C, a mesa etch occurs to form a vertical LED. This may be a second etch performed after that shown in FIG. 5B or may be a single etch to the depth illustrated in FIG. 5C. The trenches 155 are etched through the n-type layer 103. Part of the implanted regions 107 are etched away, but a portion of the implanted regions 107 remain on the side of the mesas 119 or on the surfaces of the trenches 155. In other words, the trench 155 is narrower than the implanted region 107, and positioned within that implanted region 107, as described above.

Ion implantation confinement or bond pad isolation forms bulk volumes around or inside a mesa or LED that may keep current away from a sidewall or from the shadows under bond pads. This may improve LED performance. Implantation also may eliminate isolation layers under a bond pad, which may be a dielectric coating. Removing this isolation layer may improve LED integrity and reliability and reduce manufacturing costs. Current confinement along the mesa or LED perimeter may provide leakage current isolation and provide current confinement in the bulk of the LED. This also improves LED integrity and reliability.

The implants used in the embodiments disclosed herein may have different profiles. For example, a Gaussian profile may be formed using a single dose implant. A box profile may be formed using a multiple dose implant. Other implant profiles may be formed by varying the parameters of the implant or the anneal.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating an LED, comprising:
    forming a device having a p-type layer, a multi-quantum well and a n-type layer disposed vertically on a substrate;
    implanting ions into a portion of a first surface of said device such that said ions implant said multi-quantum well and at least one of said n-type layer and said p-type layer so as to create implanted regions, whereby said ions increase the resistivity of said implanted regions;
    removing said substrate and turning said device to expose a second surface;
    implanting ions into a portion of said second surface of said device opposite said first surface such that said ions implant at least one of said n-type layer and said p-type layer so as to create said implanted regions; and
    attaching a bond pad to said device over said implanted regions.

2. The method of claim 1, further comprising utilizing a mask to allow ions to implant only said portion of said first surface and said portion of said second surface.

3. The method of claim 2, wherein said mask is shadow mask.

4. The method of claim 2, wherein said mask is disposed on said device.

5. The method of claim 1, further comprising attaching a metal frame to said device after said implanting step, and wherein said bond pad is attached to said metal frame.

6. The method of claim 1, wherein said bond pad has a first width and said implanted regions have a second width, said first width being approximately equal to said second width.

7. The method of claim 1, wherein said bond pad has a first width and said implanted regions have a second width, said first width being less than said second width.

8. The method of claim 1, wherein said implanting of said first surface is configured to implant said multi-quantum well said p-type layer and wherein said implanting of said second surface is configured to implant said n-type layer.

9. The method of claim 1, wherein said implanted regions extend between said first surface and said second surface.

* * * * *